United States Patent
Lin et al.

(10) Patent No.: US 6,821,895 B2
(45) Date of Patent: Nov. 23, 2004

(54) DYNAMICALLY ADJUSTABLE SLURRY FEED ARM FOR WAFER EDGE PROFILE IMPROVEMENT IN CMP

(75) Inventors: Bih-Tiao Lin, Ping-Tung (TW); Soon-Kang Huang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/371,456

(22) Filed: Feb. 20, 2003

(65) Prior Publication Data

US 2004/0166686 A1 Aug. 26, 2004

(51) Int. Cl.[7] .............................................. H01L 21/302
(52) U.S. Cl. .................... 438/691; 438/692; 438/693; 451/5; 451/8
(58) Field of Search ................................ 438/691, 692, 438/693; 451/5, 8, 41, 285

(56) References Cited

U.S. PATENT DOCUMENTS 6,159,075 A * 12/2000 Zhang ............................ 451/8
6,303,507 B1 * 10/2001 Wang et al. ................. 438/692
6,409,579 B1 * 6/2002 White, II et al. ............. 451/56

* cited by examiner

*Primary Examiner*—Lan Vinh
(74) *Attorney, Agent, or Firm*—Tung & Associates

(57) ABSTRACT

A dynamically adjustable slurry feed arm and method for adjusting the same in a CMP process including carrying out the CMP process for a predetermined period of time on a substrate comprising a polishing layer to remove a portion of a polishing layer; determining the thickness of the polishing layer at a plurality of predetermined measurement areas comprising at least a polishing layer peripheral portion and a polishing layer center portion; determining a desired subsequent dispensing position to equalize the thickness of the polishing layer; and, adjusting the slurry feed arm to the subsequent dispensing position such that the slurry is dispensed over the polishing pad at the subsequent dispensing position comprising one of closer to the polishing pad center portion and closer to the polishing pad peripheral portion.

20 Claims, 2 Drawing Sheets

DYNAMICALLY ADJUSTABLE SLURRY FEED ARM FOR WAFER EDGE PROFILE IMPROVEMENT IN CMP

FIELD OF THE INVENTION

This invention generally relates to chemical mechanical polishing (CMP) and more particularly to a dynamically adjustable slurry feed arm and method for adjusting the same for improving a polishing layer thickness uniformity including a process surface wafer edge profile in a CMP process.

BACKGROUND OF THE INVENTION

In semiconductor fabrication integrated circuits and semi-conducting devices are formed by sequentially forming features in sequential layers of material in a bottom-up manufacturing method. The manufacturing process utilizes a wide variety of deposition techniques to form the various layered features including various etching techniques such as anisotropic plasma etching to form device feature openings followed by deposition techniques to fill the device features. In order to form reliable devices, close tolerances are required in forming features including anisotropic etching techniques which rely heavily on layer planarization to form consistently deep anisotropically etched features.

In addition, excessive degrees of surface nonplanarity will undesirably affect the quality of several semiconductor manufacturing processes including, for example, photolithographic patterning processes, where the positioning the image plane of the process surface within an increasingly limited depth of focus window is required to achieve high resolution semiconductor feature patterns.

Chemical mechanical polishing (CMP) is increasingly being used as a planarizing process for semiconductor device layers, especially for devices having multi-level design and smaller semiconductor fabrication processes, for example, below about 0.25 micron. CMP planarization is typically used several different times in the manufacture of a multi-level semiconductor device, including planarizing levels of a device containing both dielectric and metal portions to achieve global planarization for subsequent processing of overlying levels.

For example, in the CMP of oxide containing layers such as dielectric insulating layers also referred to as inter-layer dielectric (ILD) layers and inter-metal dielectric (IMD) layers, it is important to achieve a high degree of planarity during ILD removal. For example, following formation of the ILD layer, via formation process is carried out to form electrical interconnections between electrically conductive portions of an underlying ILD layer and an electrically conductive portion of an overlying ILD layer. In the event that the thickness uniformity is not within specifications following the oxide or ILD CMP process, a subsequent anisotropic etching process in relatively thicker ILD layer portions to form the via interconnect, for example at a wafer edge portion (e.g., periphery) may not be sufficiently deep to make contact with the conductive portion of the underlying ILD layer, thus resulting in an open circuit in the integrated circuit semiconductor device. On the other hand, if the wafer edge portion is relatively overpolished resulting in a relatively thinner ILD layer portion, a subsequent via etching process can result in metal thinning in the underlying conductive region altering electrical resistances.

The well known Preston equation generally explains the polishing mechanism for dielectric layers, particularly $SiO_2$ containing dielectric layers. Generally the rate of removal is proportional to the applied pressure, the relative velocity between the wafer and the polishing pad and a proportionality constant that takes into account other variables such as the hardness of the dielectric, the slurry, and the polishing pad.

One process that is as yet not quantitatively understood is the role of the slurry in forming a hydrodynamic layer underneath the wafer polishing surface during CMP. The distribution of the slurry with respect to the polishing surface has received little attention in the prior art. For example, it is known that both mechanical and chemical processes account for polishing of the surface. For example, chemical processes are known to dominate on the micro scale in removing material while mechanical processes dominate on the macro scale, for example in removing high spots on the wafer surface. In addition, the condition of the polishing pad affects both chemical and mechanical processes.

Prior art processes have proposed feeding the slurry through the polishing pad to make the delivery of the slurry to the wafer polishing surface more uniform. This process has met with some success but has proved difficult to control with respect to varying polishing pad surfaces and the particular CMP machine used. For example, the edge of the wafer may tend to get a higher or lower supply of slurry due to the complex relative motion of the polishing pad and the wafer polishing surface which may be moved at varying rates relative to one another. Prior art approaches to compensate for this effect have included making the wafer holder surface (carrier) slightly convex to achieve higher polishing rates at the center portion of the wafer. This approach is highly dependent on the type of slurry, the nature of the polishing pads, and the CMP machine, making consistent results a sort of 'black art' based on trial and error approaches.

Therefore, there is a need in the semiconductor art to develop an improved CMP method and apparatus whereby the slurry may be selectively delivered to achieve consistently uniform polishing layer thicknesses by selectively delivering the slurry to predetermined areas of the polishing pad to compensate for differing material removal rates across the wafer surface.

It is therefore an object of the invention to provide an improved CMP method and apparatus whereby the slurry may be selectively delivered to achieve consistently uniform polishing layer thicknesses by selectively delivering the slurry to predetermined areas of the polishing pad to compensate for differing material removal rates across the wafer surface while overcoming other shortcomings and deficiencies in the prior art.

SUMMARY OF THE INVENTION

To achieve the foregoing and other objects, and in accordance with the purposes of the present invention, as embodied and broadly described herein, the present invention provides a dynamically adjustable slurry feed arm and method for adjusting the same in a CMP process.

In a first embodiment, the method includes carrying out the CMP process for a predetermined period of time on a substrate comprising a polishing layer to remove a portion of a polishing layer; determining the thickness of the polishing layer at a plurality of predetermined measurement areas comprising at least a polishing layer peripheral portion and a polishing layer center portion; determining a desired subsequent dispensing position to equalize the thickness of the polishing layer; and, adjusting the slurry feed arm to the subsequent dispensing position such that the slurry is dispensed over the polishing pad at the subsequent dispensing position comprising one of closer to the polishing pad center portion and closer to the polishing pad peripheral portion.

These and other embodiments and features of the invention will be better understood from a detailed description of the preferred embodiments of the invention which are further described below in conjunction with the accompanying Figures.

DETAILED DESCRIPTION OF THE PREFERRED EMBODIMENTS

While the method according to the present invention is explained with reference to an oxide containing ILD layer, it will be appreciated that the method of the present invention may be advantageously applied to the removal of any dielectric layer where selective delivery of the slurry to the polishing pad surface may be advantageously selected to compensate for differing material removal rates of a polishing layer.

Figure 1A:
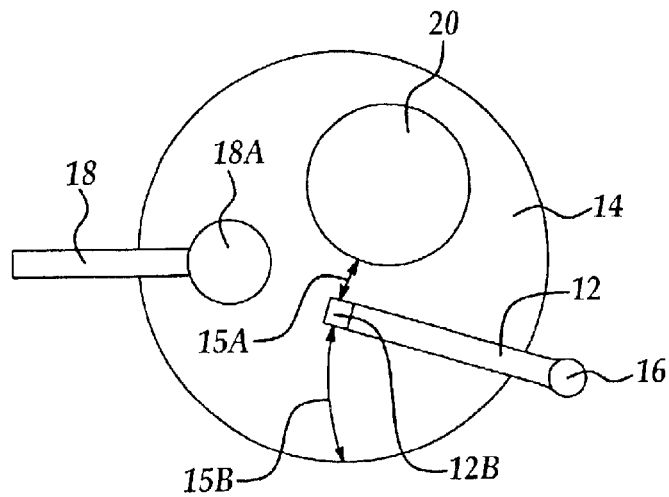
FIG. 1A is a top view of an exemplary CMP slurry feeder arm and CMP system according to an embodiment of the present invention.

Referring to FIG. 1A is shown a top view of an exemplary embodiment of a CMP polishing system including a selectively adjustable slurry feed arm e.g., 12 according to an embodiment of the invention, positioned above a rotatable polishing pad surface 14, for example adhesively attached to an underlying rotatable platen (not shown). The slurry feed arm may be any shape, for example curved, L shaped, or extending directly from a slurry feed arm positioning means (as shown), for example pivoting joint 16. Included in pivoting joint 16 is a means for selectively adjusting the slurry feed arm 12 slurry dispensing point, for example the distal end 12B, to a predetermined position over the polishing pad surface, for example by moving the slurry feed arm in a radial pathway above the polishing pad surface 14 around the pivoting joint 16 as shown by directional arrow 15A and 15B. For example, the pivoting joint 16 includes an adjustable stepper motor for selectively moving a moveable shaft (not shown) to which the slurry feed arm 12 is attached at the pivot joint 16 to move the slurry feed arm slurry dispensing point, e.g., distal end 12B. Preferably, the slurry dispensing position of the slurry feed arm may be selectively moved toward the center of the polishing pad or toward the periphery of the polishing pad as indicated by directional arrows 15A and 15B. Preferably, the means for selectively adjusting the slurry feed arm, for example a stepper motor, allows the slurry dispensing position to be moved in increments as small as 2 mm increments, more preferably as small as 1 mm increments.

In operation, the slurry feed arm e.g., 12 projects over the associated polishing pad surface e.g., 14 at a predetermined position and dispenses polishing slurry onto the polishing pad surface during the polishing (CMP) process. During the polishing process, a process wafer (not shown) is held in place by a carrier head e.g., 20 with the wafer process surface contacting the polishing pad 14 at a predetermined pressure. For example, the carrier head 20 holds a process wafer in place by mechanical means or by negative pressure means including an ability to selectively put varying pressure over the wafer backside to selectively increase pressure at a center portion and at a peripheral portion of the wafer. The slurry feed arm 12 preferably includes separate liquid supply tubes (not shown) housed within the slurry feed arm 16 to separately provide polishing slurry and cleaning or rinsing liquid, respectively, to the surface of the polishing pad e.g., 14. The slurry feed arm 12 optionally includes several spray nozzles (not shown) to provide a high-pressure rinse at the end of each polishing and conditioning cycle. It will be appreciated that the slurry feed arm 12 may include more than one slurry dispensing opening e.g., at 12B along the slurry feed arm, but hereinafter the dispensing position of the arm will refer to the position of the most distal slurry dispensing opening, for example located in a distal segment e.g., 12B of the slurry feed arm 12. Optionally included in the CMP polishing system along with the dynamically adjustable slurry feed arm 12 is a pad conditioner arm e.g., 18, for example including a diamond embedded conditioning pad 18A contacting surface for pre-conditioning the polishing pad 14. It will be appreciated that several dynamically adjustable slurry feed arms may be included in a multi polishing station system for CMP polishing of semiconductor process wafers at least one dynamically adjustable slurry feed arm preferably provided for each polishing station. For example, the various polishing stations may be used for different polishing steps in a sequential CMP polishing procedure. In operation, the polishing pad 14 is rotated simultaneously with the rotation of carrier head 20, the polishing pad and the carrier head rotating in the same or opposite directions. The carrier head 20 including the wafer process surface held in contact with the polishing pad is simultaneously rotated and optionally linearly moved across the polishing pad surface e.g., 14.

In one embodiment of the invention, a means for in-situ monitoring the remaining thickness of the polishing layer (layer being polished), preferably an optically transparent material layer, for example an oxide layer, is provided with the CMP polishing system including the dynamically adjustable slurry feed arm. For example the means for monitoring the thickness of the oxide layer is preferably by periodic optical measurements of the wafer polishing surface. For example, optical interferometry as is known in the art may be applied to the frontside or the backside of the wafer using single or multiple wavelength techniques including ultraviolet and visible wavelengths or infrared wavelengths applied to a silicon wafer backside.

Figure 1B:
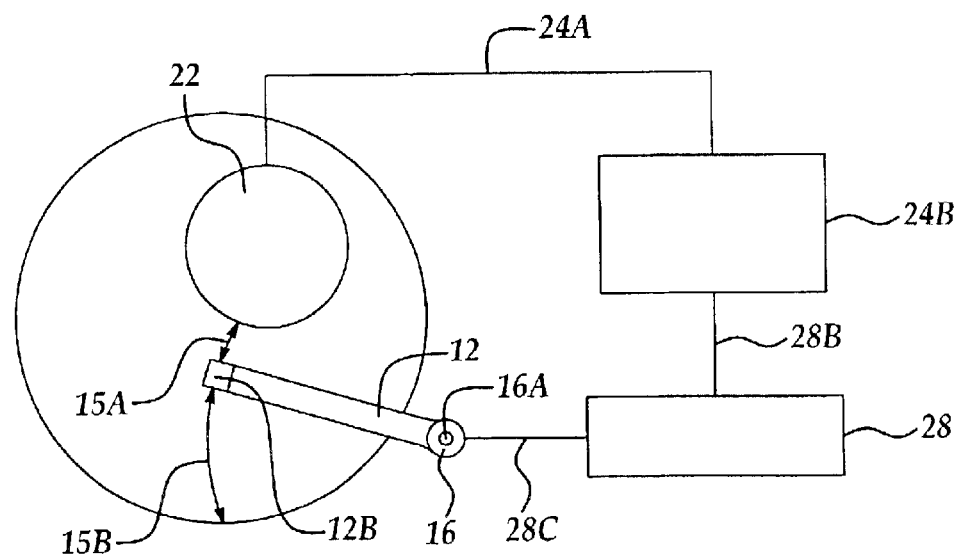
FIG. 1B is a top view of a portion of an exemplary dynamically adjustable slurry feeder arm and CMP system according to an embodiment of the present invention.

Referring to FIG. 1B, is shown an exemplary portion of a CMP polishing system including the dynamically adjustable feed arm 12, showing a top view of a wafer carrier head 22 including a light communication pathway 24A, for example including a plurality of optical fibers supplied to predetermined measuring areas over the backside of the process wafer for supplying optical signals, for example infrared wavelengths and receiving optical signals reflected from the frontside wafer process surface, for example, including an oxide layer being polished (oxide polishing layer) in a CMP process. For example, light communication pathway 24A is in signal communication with an optical signal detector/analyzer 24B, for example including one or more optical detectors and means for collecting and analyzing a spectrum signal strength and phase of a reflected light signal received from the polishing layer, for example in an optical interferometry process. It will be appreciated that signal communication may include wireless communication from light sensors (detectors) embedded in the wafer carrier head 22 and transmitted to the optical signal analyzer 24B. It will also be appreciated that the optical sources and optical signal collectors may be positioned under the polishing platen, the polishing platen and polishing pad provided with a window (not shown) for sampling the polished (frontside) of the wafer. There are several commercially available optical interferometers for making optical interferometry measurements which may be suitably used with the present invention provided a plurality of optical measurement data may be collected from the optical signal analyzer/detector at predetermined optical measurement areas disposed across at least one diameter of the process wafer surface including at least a peripheral and a central portion of the polishing surface, from which a remaining polishing layer thickness may be subsequently extracted. In one embodiment, the optical measurement data includes polishing rate data from predetermined optical measurement areas which are periodically collected and transferred to a data receiving, manipulation and signal outputting means unit, for example a controller 28, for automated analysis, preferably in real time during the CMP process, to periodically determine a remaining polishing layer thickness at the predetermined optical measurement areas. Preferably, the controller 28 is preprogrammed to output commands to the slurry feed arm adjustment means in response to a determined polishing layer thickness to move the slurry dispensing position to a predetermined subsequent position, followed by a subsequent CMP polishing time period, the steps of in-situ measurement, transfer, polishing layer thickness determination, and slurry feed arm adjustment being optionally repeated to produce a polishing layer with an improved thickness uniformity including a polishing layer edge (peripheral) profile.

In another embodiment, an ex-situ polishing layer thickness measurement means may be used as long as measurement data may be collected along at least one diameter of the process wafer surface from which a remaining polishing layer thickness may be extracted including at least a peripheral and a central portion of the polishing surface. For example, in a near-real time ex-situ process, one or more thickness monitor wafers with substantially similar polishing layers may be provided to undergo a CMP polishing process in parallel with the process wafer, the one or more thickness monitor wafers being removed periodically to undergo an ex-situ thickness measuring process, including optical methods, for example FTIR spectroscopy or ellipsometry. Preferably, the ex-situ measurement results are then transferred to the controller 28 which includes preprogrammed instructions and takes steps similar to the in-situ process. For example, a polishing layer thickness including at least a center portion and a peripheral portion of the polishing wafer is determined followed by appropriate instructions to move the slurry feed arm to a new dispensing position in response to the determined polishing layer thickness, for example a thickness difference between a peripheral portion and a center portion of the wafer.

Still referring to FIG. 1B, in exemplary operation, a plurality of optical measurement data points collected by the optical measurement means, for example the optical signal detector/analyzer 24B in an optical interferometry measurement, are collected from the optical measurement points made along at least one wafer process surface diameter, preferably including the wafer polishing surface periphery and center portion. The collected optical measurement data points are transferred to controller 28, for example including at least a processor (e.g., CPU), memory, and a signal receiving and output unit for communicating with the optical signal detector/analyzer 24B by communication line 28B and the slurry feeder arm adjustment means 16 by communication pathway 28C. It will be appreciated that wireless communication may be suitably used as the communication pathways. Preferably, the adjusting means is a stepper motor for selectively pivoting the slurry feed arm 14 around a pivoting point 16A in a radial pathway over the polishing pad surface, preferably extending from the polishing pad periphery to the center portion of the polishing pad as indicated by direction arrows 15A and 15B. Preferably, the controller 28 is supplied with a computer program loaded (e.g., compiled) in memory, optionally including a graphical interface for interactive program flow control and data display, for selectively receiving and analyzing at least a portion of the optical measurement data. The computer program preferably includes preprogrammed instructions for determining a thickness of the polishing material layer from optical measurement data preferably including measurement data disposed along at least one diameter of the wafer polishing surface, determining a desired subsequent slurry dispensing position of the slurry feeder arm in a subsequent polishing period to increase a polishing layer thickness uniformity, and outputting instructions to move the slurry feeder arm to the desired subsequent slurry dispensing position for carrying out a subsequent CMP polishing period. The preprogrammed instructions preferably include predetermined time periods for collecting the optical measurement data and adjusting the slurry feeder arm the data collection, data analysis, and slurry feed arm positioning command functions preferably acting as a parallel process to the CMP polishing process and optical measurement process.

In one embodiment, the computer program includes programmable instructions for determining a desired dispensing position of the slurry feeder arm according to a predetermined relationship. For example, a predetermined relationship is included in the preprogrammed instructions for determining a desired slurry feeder arm position in response to an input of a determined thickness difference of the polishing layer, preferably including at least at a center portion and a peripheral portion of the polishing layer. In another embodiment, the programmable instructions are based on a decision tree, for example the slurry feeder arm subsequent dispensing position is determined in response to an input of a determined thickness difference between a center portion and a peripheral portion of the polishing layer.

Figure 2:
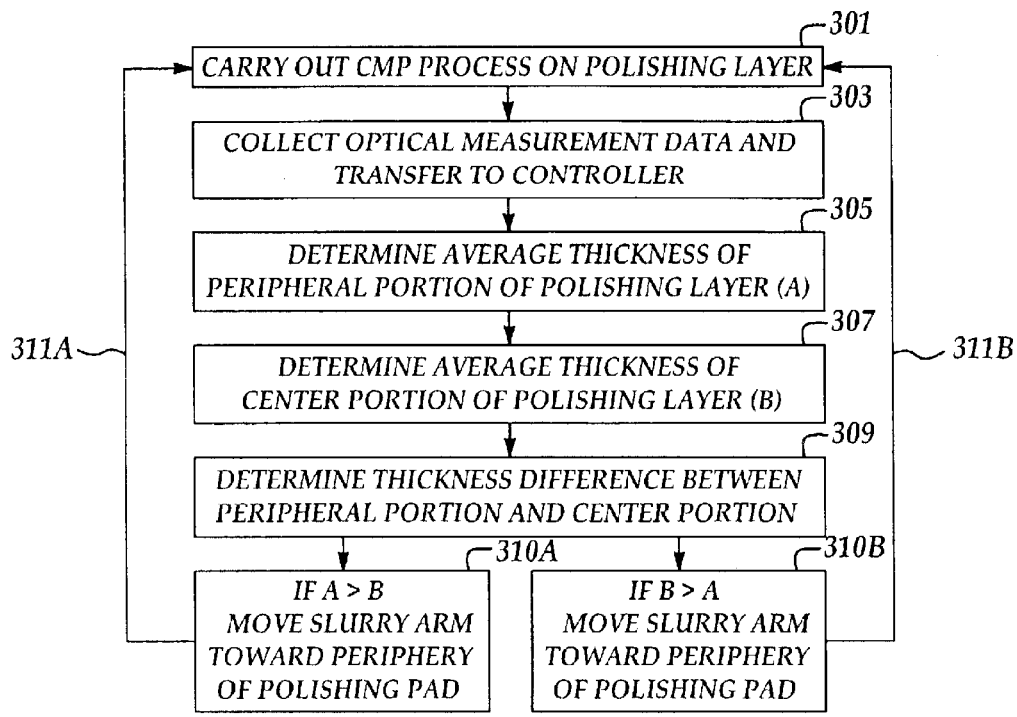
FIG. 2 is an exemplary process flow diagram according to an embodiment of the present invention.

Referring to FIG. 2, shows an exemplary implementation of a programmable process for determining the desired position of the slurry feeder arm in response to a thickness determination of a polishing oxide layer according to a process flow diagram. In process 301, a CMP process is carried out on an optically transparent (e.g., oxide material layer) In process 303, optical measurement data along a diameter (measurement line) of the process wafer, for example a plurality of evenly spaced points, are collected and transferred to process controller to determine a corresponding thickness of the optically transparent polished material layer determined (e.g., oxide). In process 305, an average thickness A at the periphery or edge is determined, for example by determining a corresponding polishing layer thickness on opposing periphery sides of the measurement line for example by averaging four thickness values, two thickness values on opposing sides of the measurement line at the wafer periphery. In process 307, an average thickness B of a center portion is then determined, for example by averaging the thickness of at least three thickness values corresponding to points on the measurement line crossing the wafer center portion. In process 309, a difference between a center portion thickness and an edge portion thickness is determined. If the average peripheral thickness A is greater than the average center portion thickness B, process 310A is carried out where the controller outputs instructions to the slurry feed arm to move the dispensing position a predetermined distance toward the periphery of the polishing pad. If the average peripheral thickness A is less than the average center portion thickness B, process 310B is carried out where the controller outputs instructions to the slurry feed arm to move the dispensing position a predetermined distance toward the center of the polishing pad. As indicated by process directional arrows 311A and 311B, the processes 301 through 310 are optionally repeated.

For example, depending on the magnitude of the polishing layer thickness difference between a center portion and a peripheral portion of the polishing surface, the dispensing end of the slurry feed arm may be moved an amount determined according to predetermined relationship between desired thickness difference change and slurry arm position. Alternatively, the slurry feed arm may be moved a predetermined distance based on a decision tree, for example depending on whether a thickness difference is greater than a predetermined thickness difference window. For example, the relationship may be linear or non linear. For example according to a linear relationship, the slurry feeder arm (slurry dispensing end) is moved a predetermined amount from the previous slurry feed arm position based on a determined thickness difference. For example, in one embodiment, the dispensing position of the slurry feeder arm is moved from a previous polishing position including an initial polishing position, for example lying at about the midway of the polishing pad, about 1 mm toward either the center or peripheral portion of the polishing pad for every 100 Angstroms of thickness difference between the center portion and the peripheral portion of the polishing surface. For example, the dispensing position of the slurry arm is moved with respect to a previous slurry arm dispensing position toward the center of the polishing pad if the center portion is relatively thicker and away from the center of the polishing pad (toward the periphery) if the peripheral portion of the polishing layer is relatively thicker.

Alternatively, the dispensing position of the slurry arm is moved with respect to a previous slurry arm dispensing position according to a decision tree. For example the dispensing position is moved a predetermined distance toward the center or periphery of the polishing pad if the center portion is thicker or thinner, respectively, by greater than a predetermined amount. For example, the dispensing position of the slurry arm is moved toward the center (or periphery) of the polishing pad from a previous polishing position by about 2 mm provided the polishing layer center portion is thicker than the peripheral portion by greater than about 250 Angstroms and by about 4 mm if the thickness difference is greater than 400 Angstroms. Likewise, the slurry arm position is moved toward the periphery of the polishing pad from a previous polishing distance according to the same recipe if the peripheral portion of the polishing surface is thicker than the center portion according to predetermined thickness differences.

In another embodiment, the controller additionally includes a database including previously archived results including feeder arm position and difference in thickness achieved between at least a periphery portion of the wafer polishing surface and a center portion corresponding to a polishing period at a slurry feed arm dispensing position. Preferably, a relationship between a slurry feeder arm dispensing position and desired degree of thickness variation across at least one diameter of the wafer polishing surface of the oxide polishing layer is derived to project a desired slurry feeder arm position to achieve the desired degree of thickness variation, for example preferably uniform thickness, in a subsequent CMP polishing period.

Figure 3:
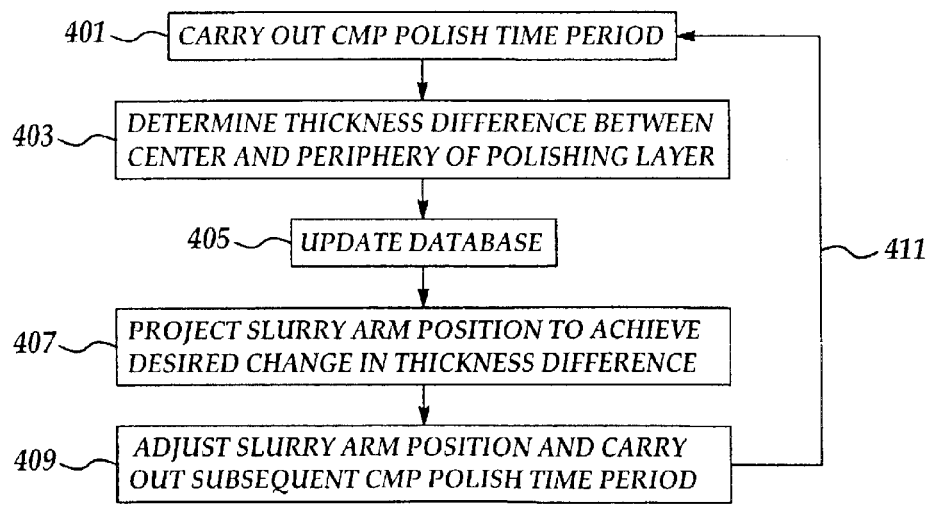
FIG. 3 is an exemplary process flow diagram according to an embodiment of the present invention.

For example, referring to FIG. 3 is a process flow diagram exemplifying another embodiment of the process for dynamically adjusting the slurry feed arm. In process 401, a CMP process is carried out on a polishing layer for a predetermined time period. In process 403, a plurality of polishing layer thickness measurement points are collected along at least one diameter of the wafer process surface. The polishing layer thickness measurement points preferably include at least a peripheral thickness and a center portion thickness of the polishing layer form which a thickness difference is determined between the peripheral portion and the center portion. In process 405, a database of archived data is updated including slurry arm position and thickness change. In process 407, a projected change in the slurry feed arm dispensing position is then determined to achieve a desired thickness difference change. For example, the projection is made by referenced to the database of archived data including applying either a previously determined or a newly derived relationship correlating the slurry feed arm dispensing position and polishing layer thickness difference change between the center and periphery portion of the polishing layer. Preferably, the projected change in slurry arm dispensing position is determined to minimize a difference in the polishing layer thickness between a center portion and peripheral portion in a subsequent CMP polishing time period. In process 409, the slurry arm is repositioned to the projected slurry arm dispensing position and a subsequent CMP polishing time period carried out. As indicated by direction process arrow 411, processes 401 through process 409 are optionally repeated to achieve a reproducibly consistent polishing layer thickness uniformity including a polishing layer edge profile in a CMP process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for performing a chemical mechanical polishing (CMP) process on a semiconductor process wafer to compensate in-situ for differing material removal rates comprising the steps of:

a) providing at least one slurry feed arm arranged in a first dispensing position for dispensing slurry onto a polishing pad in a CMP process;

b) carrying out the CMP process for a predetermined period to remove a portion of a polishing layer comprising a process wafer;

c) determining the thickness of the polishing layer at a plurality of predetermined measurement areas comprising at least the process wafer peripheral portion and the process wafer center portion;

d) determining a desired subsequent dispensing position in response to the thickness determination to approach a uniform thickness of the polishing layer; and, e) adjusting the slurry feed arm to the subsequent dispensing position comprising one of closer to polishing pad center portion and closer to the polishing pad peripheral portion to compensate for differing material removal rates of the polishing layer.

2. The method of claim 1, wherein the subsequent dispensing position is closer to the polishing pad center portion in the case the polishing layer at the process wafer center portion is thicker than the polishing layer at the process wafer peripheral portion.

3. The method of claim 1, wherein the subsequent dispensing position is closer to the polishing pad peripheral portion in the case the polishing layer at the process wafer peripheral portion is thicker than the polishing layer at the process wafer center portion.

4. The method of claim 1, wherein steps b) through e) are repeated periodically during the CMP process.

5. The method of claim 1, wherein step c) comprises one of an in-situ and ex-situ optical measurement of the polishing layer.

6. The method of claim 5, wherein the optical measurement process comprises optical interferometry.

7. The method of claim 5, wherein the thickness of the polishing layer is determined according to measurement areas disposed along at least one diameter of the process wafer.

8. The method of claim 1, wherein the step d) comprises carrying out a set of preprogrammed instructions according to an automated process to determine a thickness difference between the polishing layer at the process wafer center portion and the polishing layer at the process wafer peripheral portion.

9. The method of claim 8, wherein the step e) comprises carrying out a set of preprogrammed instructions according to an automated process to output instructions to adjust the slurry arm to the subsequent dispensing position in response to the thickness difference.

10. The method of claim 9, wherein the preprogrammed instructions employ a predetermined relationship wherein the subsequent dispensing position is selected in response to the thickness difference compared to a previously determined thickness difference.

11. The method of claim 9, wherein the preprogrammed instructions employ a predetermined decision tree comprising a predetermined thickness difference window compared to the thickness difference to select the subsequent dispensing position.

12. The method of claim 10, further comprising reference to archived data to determine the predetermined relationship.

13. The method of claim 12, wherein steps b) through e) are repeated at least once followed by archiving data comprising the subsequent dispensing position and the thickness difference change.

14. A method for adjusting a slurry feeder arm position in a chemical mechanical polishing (CMP) process to compensate for differing material removal rates comprising the steps of:

a) carrying out a first CMP polishing period including supplying slurry from a slurry arm including a dispensing position for a predetermined period of time on a process wafer comprising a polishing layer to remove a portion of a polishing layer;

b) determining a thickness of the polishing layer in-situ along the process wafer surface comprising at least a polishing layer peripheral portion and a polishing layer center portion;

c) determining a desired subsequent dispensing position in a subsequent CMP polishing period in response to a thickness difference of the polishing layer peripheral portion compared to the polishing layer center portion; and, d) adjusting the slurry feed arm to the subsequent dispensing position comprising one of toward the polishing pad center portion in the case the polishing layer center portion is thicker than the polishing layer peripheral portion and toward the polishing pad peripheral portion in the case the polishing layer peripheral portion is thicker than the polishing layer center portion.

15. The method of claim 14, wherein the step of determining a thickness comprises an in-situ optical measurement process.

16. The method of claim 14, wherein the preprogrammed instructions employ a predetermined relationship wherein the subsequent dispensing position is selected in response to the thickness difference compared to a previously determined thickness difference.

17. The method of claim 14, wherein the preprogrammed instructions employ a predetermined decision tree comprising a predetermined thickness difference window compared to the thickness difference to select the subsequent dispensing position.

18. The method of claim 14, wherein steps b) through e) are repeated at least once followed by archiving data comprising the subsequent dispensing position and an associated thickness difference change.

19. The method of claim 14, wherein the step c) comprises carrying out a set of preprogrammed instructions according to a computer controlled program to determine the thickness difference.

20. The method of claim 19, wherein the step d) comprises carrying out a set of preprogrammed instructions according to a computer controlled program to output instructions to adjust the slurry arm to the subsequent dispensing position in response to the thickness difference.

* * * * *